[19] United States Patent
Oshima et al.

[11] Patent Number: 4,639,548
[45] Date of Patent: Jan. 27, 1987

[54] DIGITAL COMMUNICATION SYSTEM INCLUDING AN ERROR CORRECTING ENCODER/DECODER AND A SCRAMBLER/DESCRAMBLER

[75] Inventors: Goro Oshima; Kotaro Kato, both of Tokyo, Japan

[73] Assignee: NEC Corporation, Japan

[21] Appl. No.: 718,725

[22] Filed: Apr. 1, 1985

[30] Foreign Application Priority Data

Apr. 3, 1984 [JP] Japan ................................. 59-67237

[51] Int. Cl.[4] .............................................. H04L 9/00
[52] U.S. Cl. .......................................... 380/43; 380/2; 380/48; 380/46; 371/46; 371/47
[58] Field of Search ................. 178/22.1, 22.13, 22.17, 178/22.19; 371/43, 46, 47

[56] References Cited
U.S. PATENT DOCUMENTS 4,208,739  6/1980  Lu et al. ............................. 178/22.1
4,484,027  11/1984 Lee et al. .......................... 178/22.13

Primary Examiner—Salvatore Cangialosi
Assistant Examiner—Aaron J. Lewis
Attorney, Agent, or Firm—Laff, Whitesell, Conte & Saret

[57] ABSTRACT

An error correction code data communication system scrambles and descrambles both non-coded data and coded data by using substantially the same code process at the opposite ends of a transmission path. The frequency of the occurrence of an error correction pulse in a decoder is monitored to set up synchronization for descrambling. The transmitter includes an encoder for adding a correction code to a data signal to be transmitted, and a scrambler for randomizing the data signal. The receiver includes a descrambler for descrambling the data signal which was randomized by the scrambler, and a decoder for correcting a code error responsive to the error correction code. The scrambler modulo 2 adds an output of a random signal generator to both an input data signal and an output data signal. The descrambler modulo 2 adds an output of a second random signal generator to both an input data signal and an output data signal.

10 Claims, 5 Drawing Figures

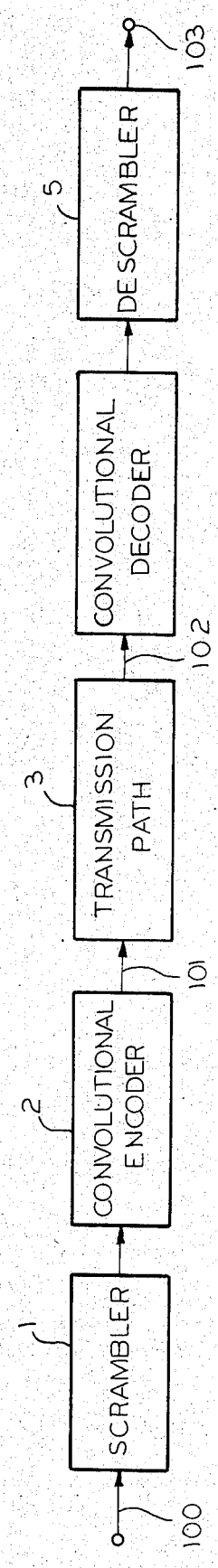
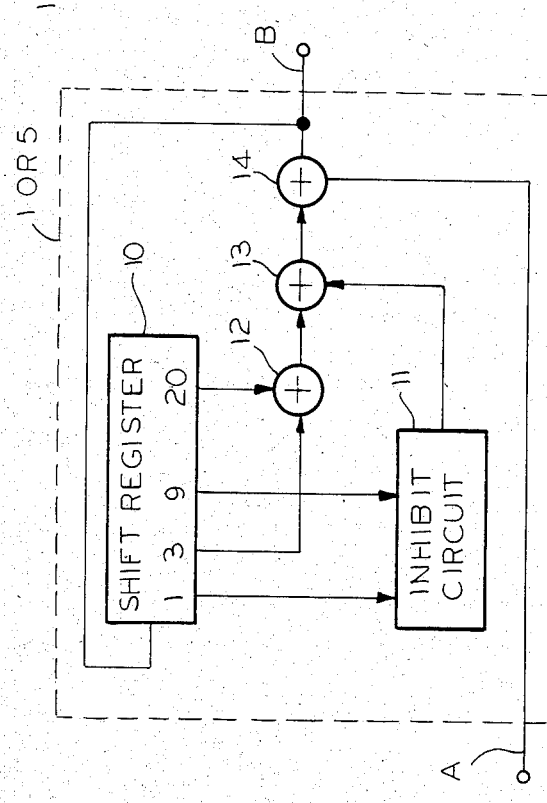
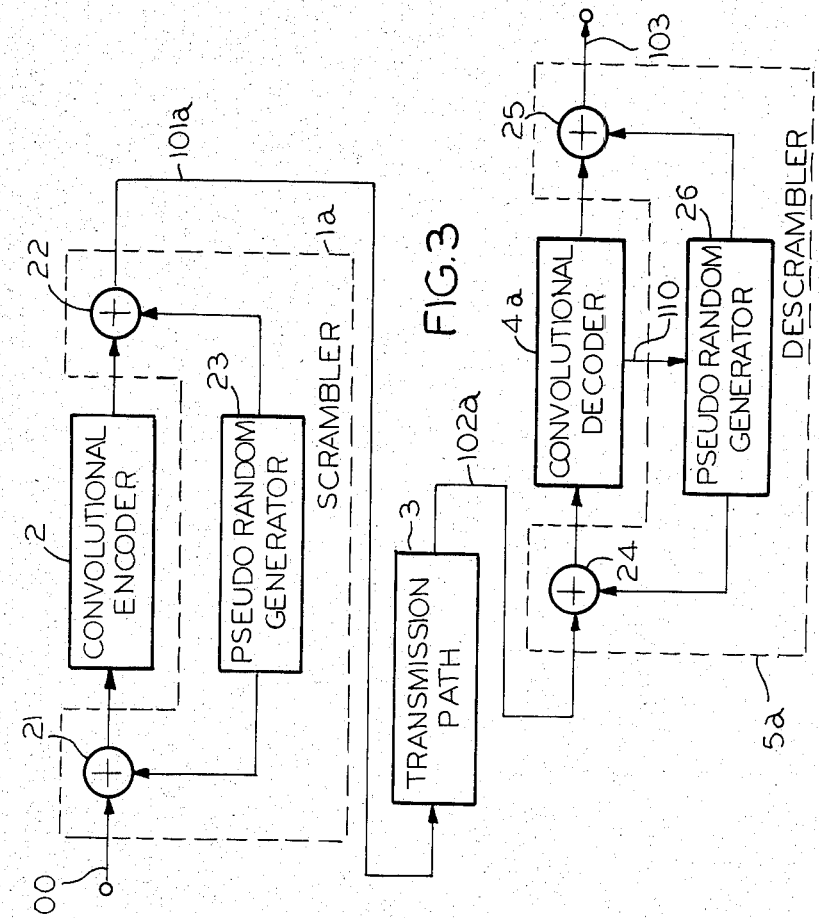
FIG.1 (PRIOR ART)
FIG.2
FIG.3

DIGITAL COMMUNICATION SYSTEM INCLUDING AN ERROR CORRECTING ENCODER/DECODER AND A SCRAMBLER/DESCRAMBLER

BACKGROUND OF THE INVENTION

The present invention relates to a digital communication system of the type using error correction codes and, more particularly, to a digital communcation system which includes an improved scrambler/descrambler.

In a digital communication system of the type described, a transmitter station passes an input data signal through a scrambler to randomize it. Then, the random signal passes through an encoder to error-correction encode the scrambler output. The encoder output is sent to a receiver station via a transmission path. The receiver station, in turn, routes the received data signal through a decoder to error-correction decode it. Then, it passes through a descrambler to randomize the decoder output to thereby recover the original data signal.

As will be described later in detail, the descrambler comprises a shift register, with an inhibit circuit connected to intermediate taps of the shift register. An Exclusive-OR gate (modulo 2 adder) is connected to intermediate taps of the shift register and to an output of the inhibit circuit. The incoming data signal is applied to the shift register by way of the Exclusive-OR gate. Also, the intermediate tap output of the shift register is fed back to the shift register via the Exclusive-OR gate. The problem encountered with such a construction is that data errors developed in the transmission path are magnified by the descrambler at the receiver station.

SUMMARY OF THE INVENTION

It is, therefore, an object of the present invention to provide a digital communication system capable of synchronizing a scrambler and a descrambler with each other without the need for a special synchronizing bit. Another object is to descramble a signal without enhancing data errors developed in a transmission path.

An error correction code data communication system of the present invention is characterized in that a transmitter scrambles both non-coded data and coded data while a receiver descrambles both non-decoded data and decoded data, by using substantially the same code process. The frequency of the occurrence of an error correction pulse in a decoder is monitored to set up synchronization for descrambling.

Specifically, an error correction code data communication system of the present invention has a transmitter and a receiver. The transmitter includes an encoder for adding a correction code to a data signal to be transmitted, and scrambler means for randomizing the data signal. The receiver includes descrambler means for descrambling the data signal randomized by the scrambler means, and a decoder for correcting a code error by means of the error correction code. The transmitter, in accordance with the present invention, comprises a random signal generator for generating a random signal in a repetitive pattern having a predetermined period. The scrambler means is constructed to modulo 2 add an output of the random signal generator to both a data signal inputted to the encoder and a data signal outputted from the encoder. The receiver comprises a random signal generator for generating a random signal in the same pattern as the signal generated by the first-mentioned random signal generator which is located in the transmitter. The descrambler means is constructed to modulo 2 add an output of the second-mentioned random signal generator to both a data signal inputted to the decoder and a data signal outputted from the decoder. The receiver further comprises means for monitoring a code error in the decoder, and means for setting up a synchronization of the second-mentioned random signal generator in response to an output of the monitoring means. This synchronization reduces the code error.

BRIEF DESCRIPTION OF THE DRAWINGS

FIG. 1 is a block diagram of a prior art error correction code data communication system;

FIG. 2 is a circuit diagram showing an example of prior art scramblers or descramblers;

FIG. 3 is a schematic block diagram of an error correction code data communication system in accordance with the present invention;

Figure 4:
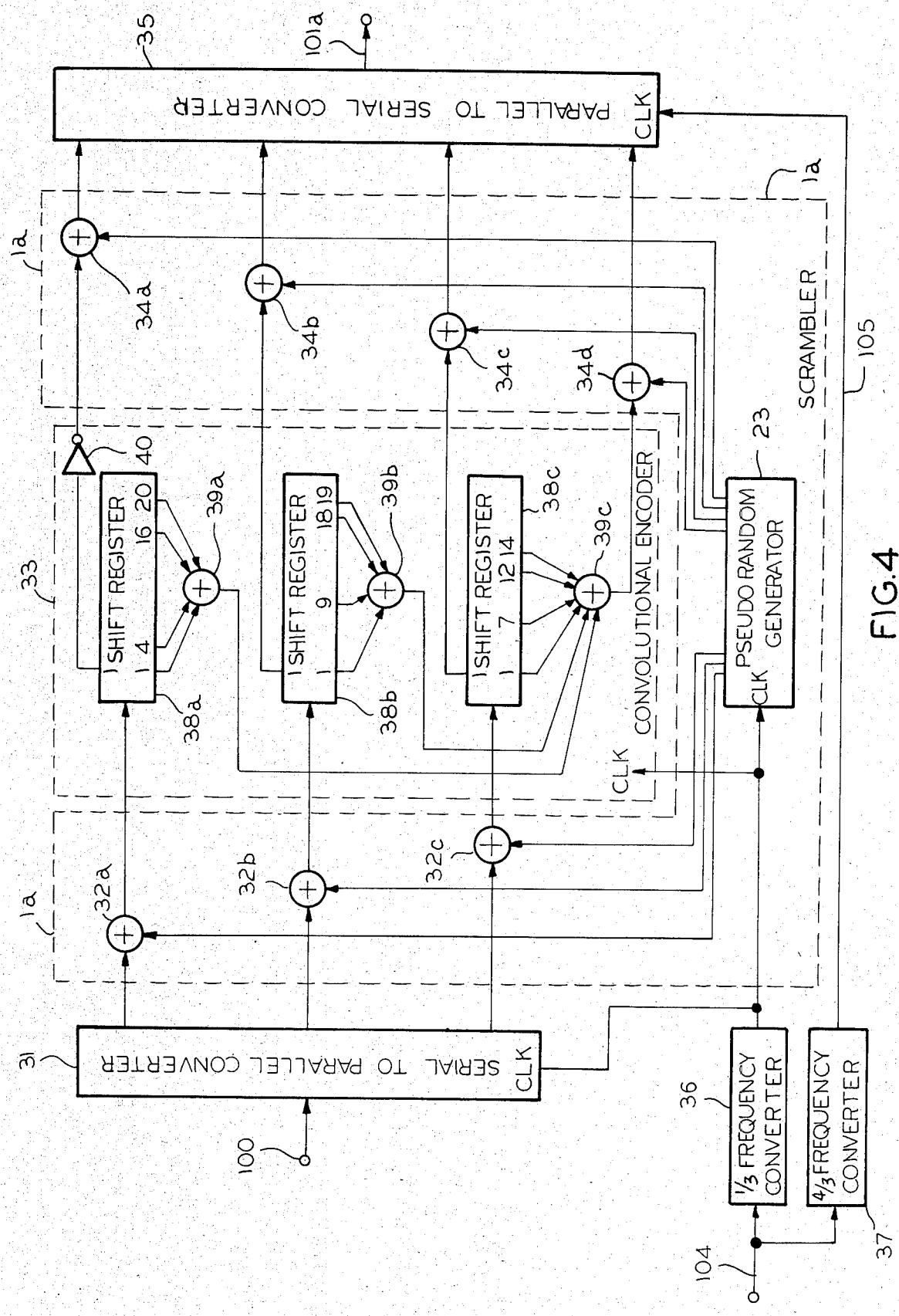
FIG. 4 is a block diagram which is representative of a transmitter forming part of the communication system of the present invention.

Reference will now be made to the accompanying drawings for describing the present invention in detail.

DETAILED DESCRIPTION OF THE INVENTION

FIG. 1 of the drawings shows a prior art data communication system of the kind which may use the invention. At a transmitter, an input data signal appearing on wire 100 is to be transmitted. First, the signal is randomized by a scrambler 1, then provided with an error correction code by a convolutional encoder 2, and then transmitted over a transmission path 3 as a transmitted data signal on wire 101. At a receiver station, on the other hand, a received input data signal coming in on wire 102 from the transmission path 3 is decoded by a convolutional decoder 4. Then, it is returned into the original signal by a descrambler 5 with a code error corrected. Then, the signal is outputted as a received output data signal on wire 103.

Desirably, an error correction code transmission system, constructed as described above, should readily set up synchronization between the scrambler 1 at the transmitter and the descrambler 5 at the receiver, without resorting to a special synchronizing bit.

Referring to FIG. 2, there is shown in a block diagram a prior art scrambler or a descrambler.

The circuitry shown in FIG. 2 represents a scrambler or a descrambler of the type which is presented in CCITT Recommendation V-35. In a scrambler mode of operation, the circuitry receives an input data signal at a terminal A and produces a scrambled data signal at a terminal B. While in a descrambler mode of operation, an input data signal is received at the terminal B and a descrambled data signal is delivered at the terminal A.

Outputs of a twenty-stage shift register 10 appearing at intermediate taps $T_3$ and $T_{20}$ are applied to an adder 12 to be modulo 2 added thereby. Meanwhile, outputs of the twenty-stage shift register 10 appearing at taps $T_1$ and $T_9$ are delivered to an inhibit circuit 11. An output of the inhibit circuit 11 and an output of the adder 12 are routed to an adder 13 also for modulo 2 addition, thereby inhibiting an occurrence wherein the data signal becomes all zeros. An output of the adder 13 and the transmit input data signal on wire 100 (FIG. 1) or a receive input data signal are summed by a modulo 2 adder 14, the output of which is applied to the terminal B (or A). The output of the adder 14 is also fed to the twenty-stage shift register 10 for a synchronizing function.

With the construction shown and described, the scrambler or the descrambler allows a transmitter and a receiver to be automatically brought into synchronization. Therefore, there is no need for a special bit or timing otherwise required for synchronization. Due to its nature, this type of circuitry is generally referred to as a self-synchronizing scrambler/descrambler and is extensively used with ordinary data transmission systems.

The prior art circuitry, however, has left the following problem unsolved. The input data signal is applied to the shift register and an output signal of intermediate taps of the shift register is fed back to the shift register. Therefore, if any error is introduced into the data while it is being propagated through the transmission path 3, the error is undesirably magnified by the descrambler. In the construction shown in FIG. 2, the twenty-stage shift register 10 has two intermediate taps. Hence, the maximum error probability of the data output from the descrambler is three times greater than the error probability associated with the transmission path.

Referring to FIG. 3, a digitial communication system embodying the present invention, which is free from the problems discussed above, is shown in an extremely skeletonized diagram.

In a transmitter, a scrambler 1a comprises a pseudo random generator 23, a convolutional encoder 2, and modulo-2 adders 21 and 22. The pseudo random generator 23 and convolutional encoder 2 are commonly interconnected via the adders 21 and 22. An output of the adder 22 is coupled to a transmission path 3. A data signal received over the transmission path 3 is applied to an adder 24 of a descrambler 5a. A convolutional decoder 4a and a pseudo random generator 26 of the descrambler 5a are commonly interconnected via modulo-2 adders 24 and 25. An output 110 of the decoder 4a is adapted to control the descrambler 5a.

First, the construction of the transmitter will be described. A transmit input data signal which appears on wire 100 and an output of the pseudo random generator 23 are applied to the adder 21 which then sums them modulo 2. An output of the adder 21 is fed in turn to a convolutional encoder 2 which then produces an error correction code. Specifically, an output of the encoder 2 includes a data signal and a parity signal. The output of the encoder 2 and the output of the pseudo random generator 23 are modulo 2 added by the adder 22. An output of the adder 22 is sent to the transmission path 3 as a transmit output data signal 101a.

Next will be described the construction of the receiver. Received input data signals appear on wire 102a, coming in from the transmission path 3 and an output of the pseudo random generator 26 are routed to the adder 24, to be summed modulo 2. An output of the adder 24 is demodulated by the convolutional decoder 4a. An output of the decoder 4a and the output of the pseudo random generator 26 are subjected to modulo 2 addition at the adder 25, the output of which is delivered as a receive output data signal 103. The synchronizing timing for the generator 26 is accomplished by monitoring the output 110 of the decoder 4a, i.e. an error correction pulse signal 110.

Details of the error correction code data communication system of the present invention will be presented. In the illustrative embodiment, the encoder 2 comprises a convolutional encoder having an encoding/decoding rate (R) of $\frac{3}{4}$, while the decoder 4a comprises a convolutional decoder with R=$\frac{3}{4}$.

Referring to FIG. 4, a construction of the transmitter in accordance with the illustrative embodiment is shown in a block diagram.

As shown in FIG. 4, the transmitter includes a serial-to-parallel (S/P) converter 31 which is connected to three adders 32a, 32b and 32c, which in turn are connected to a convolutional encoder 33 with R=$\frac{3}{4}$ (corresponding to the encoder 2 of FIG. 3).

The encoder 33 has twenty-stage shift registers 38a, 38b and 38c, modulo-2 adders 39a, 39b and 39c, and an inverter 40, which are interconnected as illustrated. The construction and operation of the encoder 33 per se are well known in the art; therefore, a detailed description of it will be omitted for simplicity. The outputs of the encoder 33 are applied to four modulo-2 adders 34a, 34b, 34c and 34d which are connected to a parallel-to-serial (P/S) converter 35. A $\frac{1}{3}$ frequency converter 36 has an output connected to the S/P converter 31, pseudo random generator 23 and convolutional encoder 33. A 4/3 frequency converter 37 has an output connected to the P/S converter 35. The pseudo random generator 23 comprises, for example, a twenty-stage shift register, an inhibit circuit and an Exclusive OR gate and forms part of the scrambler 1a. The outputs (e.g. first to third stage outputs and seventeenth to twentieth stage outputs) of the twenty-stage shift register are connected to three adders 32a, 32b and 32c and to four adders 34a–34d, respectively.

A data signal flow-through the transmitter, as described above, will be explained hereinbelow.

A transmit input data signal 100 is applied to the P/S converter 31 to be converted into three parallel streams of data. The parallel data streams are respectively coupled to the three adders 32a–32c to be modulo 2 added to corresponding outputs of the pseudo random generator 23. The outputs of the adders 32a–32c are applied in parallel to the convolutional encoder 33 which then error-correction codes them to provide four streams of parallel data. The four parallel data streams are respectively routed to the four adders 34a–34d to be summed modulo 2 with corresponding outputs of the pseudo random generator 23. The parallel data output from the adders 34a–34d are converted by the P/S converter 35 into a serial transmit output data signal 101a.

The various sections of the transmitter are operated at individual timings which will be described.

Transmit input pulses 104, an input sync signal associated with the data signal 100, have their frequency reduced to $\frac{1}{3}$ by the $\frac{1}{3}$ frequency converter 36 in order to set up a synchronization between the output of the S/P converter 31 and the output of the pseudo random generator 23. Simultaneously, the clock pulses 104 are applied to the 4/3 frequency converter 37 to have their frequency reduced to 4/3, to provide a transmit output data signal 105. The signal 105 serves as a sync signal for synchronizing the output of the P/S converter 35 and, also, for sending it to the transmission path 3.

Figure 5:
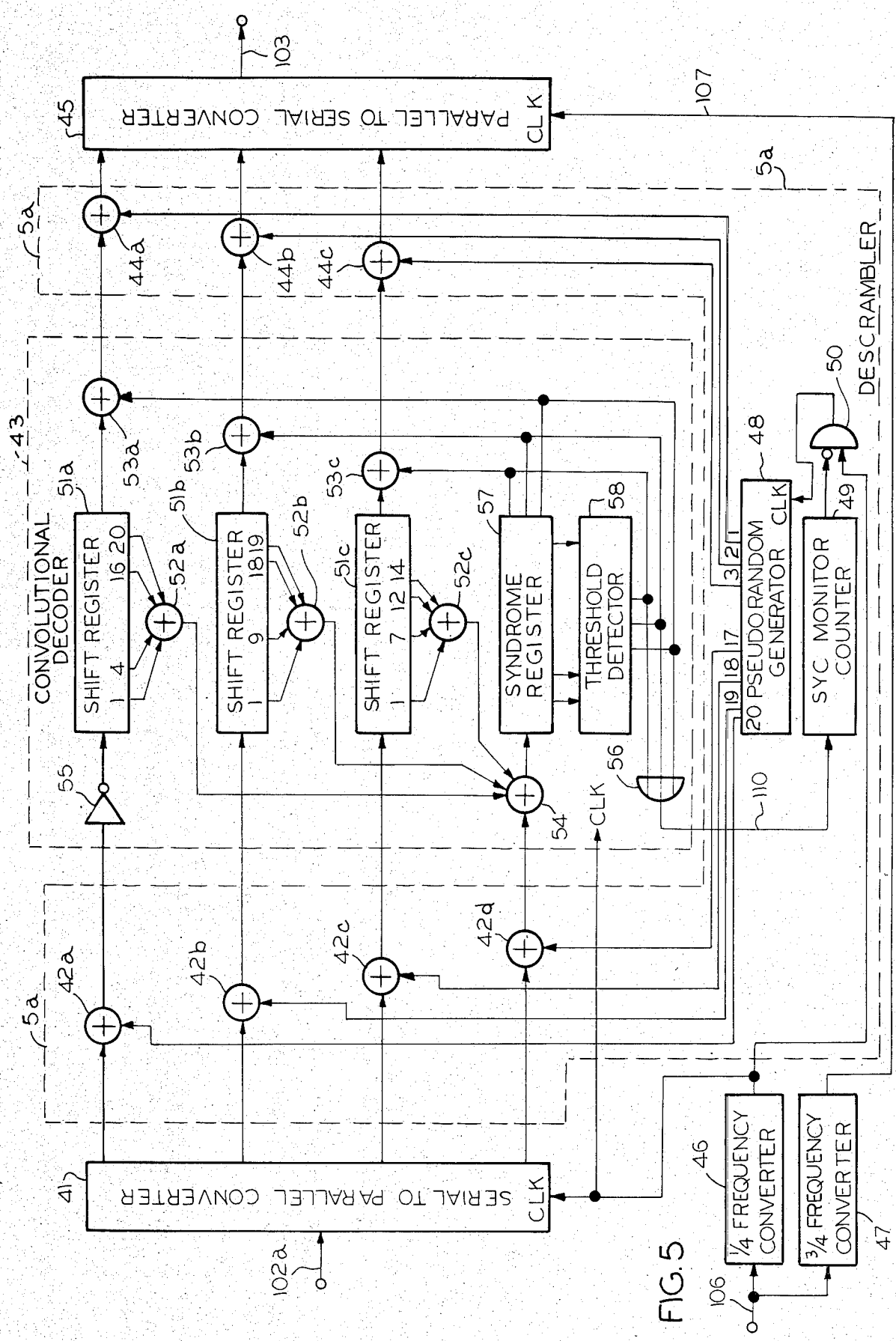
FIG. 5 is a block diagram of a receiver forming the other part of the system of the present invention.

Referring to FIG. 5, the receiver in accordance with the system of the present invention is shown in a block diagram.

As shown, the receiver includes a serial-to-parallel (S/P) converter 41 which is interconnected to four modulo-2 adders 42a, 42b, 42c and 42d, which in turn are connected to a convolutional decoder 43. The decoder 43, corresponding to the decoder 4a of FIG. 3, comprises twenty-stage shift registers 51a, 51b and 51c, Exclusive-OR gates 52a, 52b and 52c, Exclusive-OR gates 53a, 53b and 53c, an Exclusive-OR gate 54, an inverter 55, an OR gate 56, a syndrome register 57, and a threshold detector 58, all of which are interconnected as illustrated. The convolutional decoder 43 is of the well known type and, therefore, details thereof will not be described, for simplicity.

The output of encoder 43 is connected to three modulo-2 adders 44a, 44b and 44c which in turn are connected to a parallel-to-serial (P/S) converter 45. A ¼ frequency converter 46 is connected to the S/P converter 41, and a ¾ frequency convereter 47 is connected to the P/S converter 45. A pseudo random generator 48 is connected to the four adders 42a-42d and three adders 44a-44c. A sync monitor counter 49 is connected to the OR gate 56 of the convolutional decoder 43. The input of a logic circuit 50 is connected to the output of the sync monitor counter 49 and to the output of the ¼ frequency converter 46. The output of the logic circuit 50 is connected to a clock input terminal CLK of the pseudo random generator 48. The combination of pseudo random generator 48, sync monitor counter 49, and adders 42a-42d and 44a-44c constitute a descrambler 5a.

The flow of a data signal through the receiver constructed as set forth above will be described.

A receive input data signal appearing on wire 102a is applied to the S/P converter 41 to be converted to four parallel streams of data. The four adders 42a-42d modulo 2 add the four respectively parallel data streams to the outputs of the pseudo random generator 48 (e.g. the twentieth to seventeenth outputs of a twenty-stage shift register built in the generator 48). Then, the convolutional decoder 43 error-correction decodes the outputs of the pseudo random generator 48, thereby producing three parallel streams of data. These three parallel data streams are summed modulo 2 with outputs of the pseudo random generator 48 (e.g. the third to first outputs of the twenty-stage shift register inside the generator 48). The resulting parallel data streams are turned by the P/S converter 45 into a serial output receive signal which appears on wire 103. It will be noted that the pseudo random generator 48 is identical with the pseudo random generator 23 of the previously described transmitter.

The various sections of the receiver will be operated at individual timings which are presented hereinbelow.

The received input pulses on wire 106, and an input sync signal associated with the receive input data signal on wire 102a, are reduced in frequency to ¼ of the original frequency by the ¼ frequency converter 46 in order to provide a synchronization between an output of the S/P converter 41 and the output of the pseudo random generator 48. The frequency of the received input pulses is also reduced to ¾ of the original frequency by the ¾ frequency converter 47 to provide a receive output data signal on wire 107. The signal on wire 107 synchronizes the output of the P/S converter 45.

Now, the inventive synchronization between the transmitter and the receiver will be presented.

As a received input signal begins to come in on wire 102a, and while the pseudo random generator 48 is not synchronized, the threshold detector 58 of the convolutional decoder 43 generates a number of error correction pulses $C_i$, $C_j$ and $C_k$ which are applied to the sync monitor counter 49. The counter 49, in turn, generates an inhibit pulse if the number of the correction pulses is greater than a predetermined threshold value. The logics 50 provides an AND function of an inverted version of the inhibit pulse and an output of the ¼ frequency converter 46. Meanwhile the pseudo random generator 48 shifts the sync timing in response to an output of the logics 50. As a result, the synchronization of the pseudo random generator 48 is set up only when the number of the error correction pulses has decreased below the threshold value, desirably to the minimum.

In the illustrative embodiment, the output stages of the pseudo random generators 23 and 48 which are to be selected are open to choice as long as they satisfy a random condition of a data sequence required of the associated generator.

While the present invention has been shown and described as employing convolutional error codes with R=¾, it is readily applicable to any other convolutional error codes, geneally with R=n/m, as well as to block codes.

It will be seen from the above that the present invention provides an error correction code data communication system which allows a scrambler of a transmitter and a descrambler of a receiver to be synchronized without resorting to the transmission of a special sync signal. In addition, the invention prevents an input data signal from being applied to the generator 23 or 48 and, thereby, prevents a data error which is developed in a transmission path from being magnified at the receiver.

With the above advantageous features, the present invention simplifies a digital communications system of the type using error correction codes while eliminating the need for transmitting additional control signals or sync signals.

We claim:

1. An error correction code communication system having a transmitter and a receiver;
    said transmitter including an encoder for adding a correction code to a data signal which is to be transmitted, and scrambler means for randomizing the data signal;
    said transmitter further comprising a random signal generator for generating a first pseudo random signal in a repetitive pattern having a predetermined period;
    said scrambler means including means for modulo 2 adding an output of said random signal genrator to both a data signal inputted to the encoder and a data signal outputted from the encoder;
    said receiver including descrambler means for descrambling the data signal randomized by said scrambler means, and a decoder for correcting a code error by means of the error correction code;
    said receiver comprising a random signal generator for generating a second pseudo random signal being substantially the same as and synchronized therewith said first pseudo random signal;
    said descrambler means including means for modulo 2 adding an output of said second-mentioned random signal generator to both a data signal inputted to the decoder and a data signal outputted from the decoder;
    said receiver further comprising means for monitoring a code error in the decoder, and means responsive to said code error for setting up a synchronization of the second-mentioned random signal generator in response to an output of said monitoring means, said sychronization moving in a direction which reduces the code error.

2. An error correcting and scrambling digital communication systems comprising a source of digital signals, convolution encoder means having a receive input and output with said receive input coupled to said source and said receive output coupled to a transmission path to receive said digital signals from said source to said transmission path, scrambler means including a first random generator means coupled between said source and said receive input and between said receive output and said transmission path whereby said scrambler means is coupled in paralle with said convolutional encoder means, convolution decoder means having a receive input and a receive output with said receive input coupled to said transmission path and said receive output coupled to a system output terminal, and descrambler means including a second random generator means coupled between said transmission path and said receive input whereby said descrambler means is coupled in parallel with said decoder, said first and second random generator means operating in the same pattern.

3. The system of claim 2 and first modulo 2 adding means drive by said first random generator means and being coupled between said source and said receive input and between said receive output and said transmission path, and other modulo 2 adding means driven by said second random generator means and being coupled between said transmission path and said receive input and between said receive output and said system output terminal.

4. The system of claim 3 and means responsive to a threshold detection for developing a code error signal responsive to differences in the synchronism of said first and second random generator means, means responsive to said code error signal for synchronizing said first and second random signal generator means.

5. The system of claim 4 and clock means operating at a given frequency, divider means associated with each of said random generators for dividing said clock frequency and means for driving said random generators responsive to said divided frequencies from the divider means associated therewith.

6. The system of claim 5 and a serial-to-parallel converter coupled between each of said inputs and the modulo 2 adding means associated therewith and a parallel-to-serial converter coupled between said outputs and the modulo 2 adding means associated therewith, said dividing means being coupled to drive each of said converter means.

7. The system of claim 6 wherein said frequency divider associated with said first random generator means applies a ½-frequency to the serial-to-parallel converter at said receive input and to said first random generator and applies a 4/3-frequency to the parallel-to-serial converter at said receive output.

8. The system of claim 6 wherein said frequency divider associated with said first random generator means applies a ¼-frequency to the serial-to-parallel converter at said receiver input and to said first random generator and applies a ¾-frequency to the parallel-to-serial converter at said receive output.

9. The system of claim 7 wherein said frequency associated with said first random generator means applies a ½-frequency to the serial-to-parallel converter at said receive input and to said first random generator and applies a 4/3-frequency to the parallel-to-serial converter at said receive output.

10. A method of correcting errors in scrambled digital communication, said method comprising the steps of:
   (a) providing digital signals for encoding and scrambling;
   (b) encoding said signals in a convolution encoder means having a transmit input and output with said transmit input coupled to receive said digital signals and said transmit output coupled to a transmission path;
   (c) scrambling said digital signals by including a first random generator means coupled between a source of said digital signals and said transmit input and between said transmit output and said transmission path whereby said scrambler means is coupled in parallel with said convolutional encoder means;
   (d) transmitting said digital signals from said transmit output to said transmission path;
   (e) applying signals transmitted over said transmission path to the convolution decoder means having a receive input and a receive output with said receive input being coupled to said transmission path and said receive output being coupled to a system output terminal;
   (f) descrambling of said transmitted signals by including a second random generator means coupled between said transmission path and said receive input whereby a means for accomplishing said descrambling is coupled in parallel with said decoder;
   (g) operating said first and second random generator means operating in the same pattern; and
   (h) monitoring a code error in said decoder, thereby synchronizing said second random generator.

* * * * *